(12) United States Patent
Lee et al.

(10) Patent No.: US 9,070,753 B1
(45) Date of Patent: Jun. 30, 2015

(54) METHOD FOR FABRICATING MEMORY DEVICE

(71) Applicant: MACRONIX International Co., Ltd., Hsinchu (TW)

(72) Inventors: Chih-Hsiung Lee, Hsinchu (TW); Chien-Ying Lee, Hsinchu (TW); Tzung-Ting Han, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/327,255

(22) Filed: Jul. 9, 2014

(51) Int. Cl.
*H01L 21/4763* (2006.01)
*H01L 21/768* (2006.01)

(52) U.S. Cl.
CPC ...... *H01L 21/76877* (2013.01); *H01L 21/7688* (2013.01)

(58) Field of Classification Search
CPC .................. H01L 21/76877; H01L 21/7688
USPC ........................ 438/624, 666, 669, 671, 672
See application file for complete search history.

(56) References Cited

U.S. PATENT DOCUMENTS

| | | | |
|---|---|---|---|
| 2007/0057312 A1* | 3/2007 | Kim .............................. | 257/315 |
| 2007/0238240 A1* | 10/2007 | Olligs et al. .................. | 438/216 |
| 2010/0184253 A1* | 7/2010 | Hirai et al. .................... | 438/104 |
| 2012/0156841 A1* | 6/2012 | Lee et al. ...................... | 438/257 |
| 2012/0244667 A1* | 9/2012 | Kim et al. ..................... | 438/158 |
| 2012/0326313 A1* | 12/2012 | Uzoh et al. .................... | 257/751 |
| 2014/0170853 A1* | 6/2014 | Shamma et al. .............. | 438/699 |

\* cited by examiner

*Primary Examiner* — Kevin M Picardat
(74) *Attorney, Agent, or Firm* — J.C. Patents

(57) ABSTRACT

Provided is a method for fabricating a memory device. A stack layer, including a storage layer, a first conductive layer and a first mask layer, is formed on the substrate in a first region and a second region. The stack layer is patterned to form a plurality of first patterned stack layers extending along a first direction and from the first region to the second region. Two sides of each first patterned stack layers have openings respectively. A filling layer is formed on the substrate, and filled in the openings. A second mask layer is formed on the second region, and does not cover the filling layer in the second region. Then, using the second mask layer and the filling layer as mask, the first patterned stack layers and part of the substrate are removed, and a plurality of trenches are formed in the substrate in the second region.

20 Claims, 12 Drawing Sheets

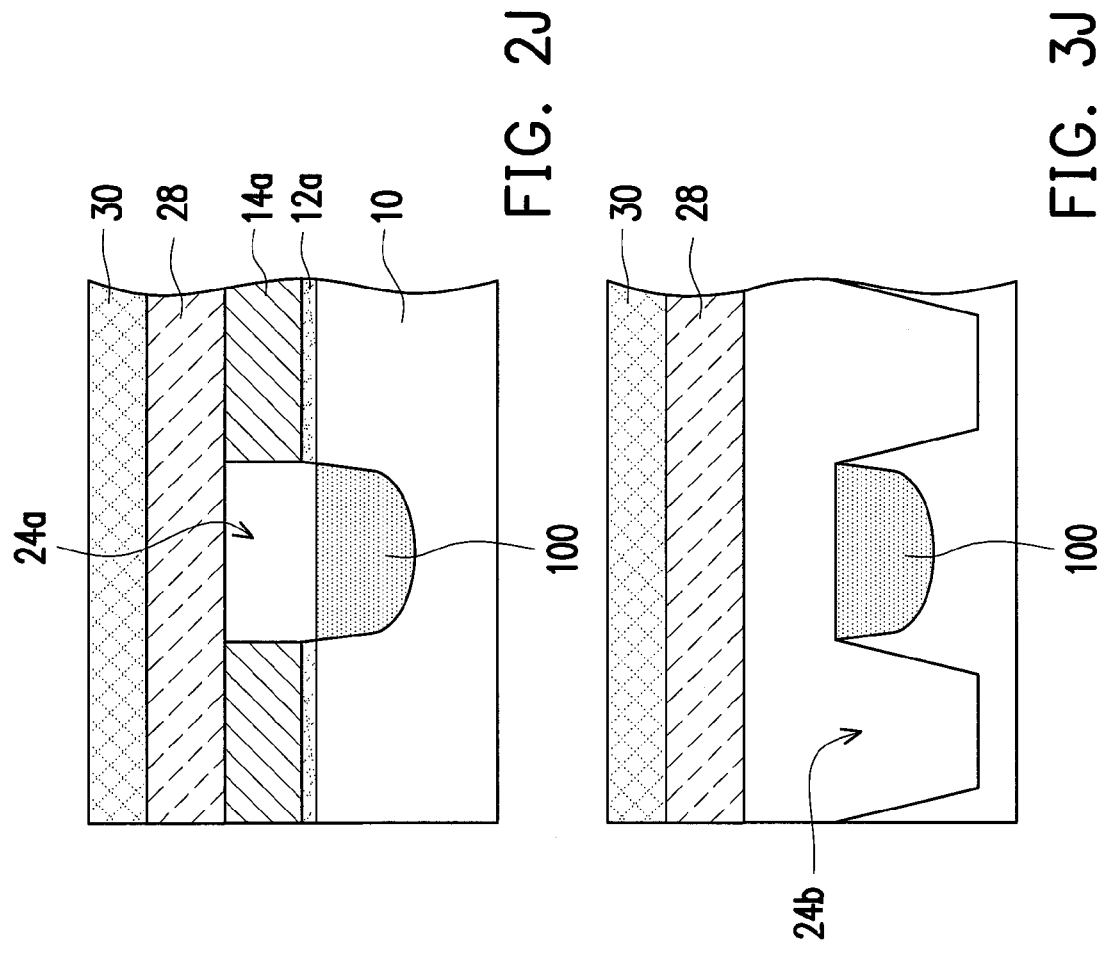
FIG. 2J
FIG. 3J
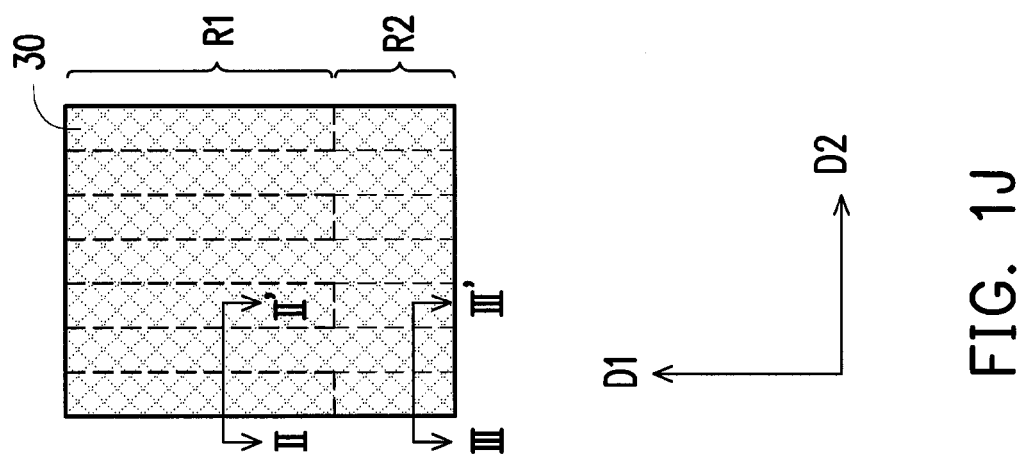
FIG. 1J

METHOD FOR FABRICATING MEMORY DEVICE

BACKGROUND OF THE INVENTION

1. Field of the Invention

The invention relates to a method for fabricating a semiconductor device, and particularly relates to a method for fabricating a memory device.

2. Description of Related Art

Memory may be categorized into volatile memory and non-volatile memory. When power supply is shut down, data stored in volatile memory disappears. However, non-volatile memory is characterized by maintaining the stored data even when the power is shut down. After the power supply is restored, the data stored in the memory may be read. Thus, non-volatile memory is generally applicable to electronic products, such as portable products.

As the integrity of memory devices increases and the size thereof is reduced, a plurality of isolation structures and dielectric layers are necessary to be formed to ensure that a plurality of memory cells are electrically insulated from each other. However, the plurality of isolation structures and dielectric layers need to be formed by undergoing a plurality of complicated photolithography processes, which may result in misalignment between the isolations and the dielectric layers and increase process variation. Thus, a fabrication method that fabricates the memory device and alleviates the issue of misalignment is urgently needed.

SUMMARY OF THE INVENTION

The invention provides a method for fabricating a memory device, which is capable of simplifying a fabrication process to achieve functions of reducing process variation and a fabricating cost.

The invention provides a method for fabricating a memory device, including providing a substrate. The substrate has a first region and a second region. A stack layer is formed on the substrate in the first region and the second region. The stack layer includes storage layer, a first conductive layer, and a first mask layer. Then, the stack layer is patterned to form a plurality of first patterned stack layers. The first patterned stack layers extend along a first direction and from the first region to the second region, and openings are respectively disposed at two sides of each of the first patterned stack layers. Then, a filling layer is formed on the substrate and fills into the openings. A second mask layer is formed on the first region of the substrate, and does not cover the filling layer in the second region. Then, using the filling layer as mask, the first patterned stack layers and part of the substrate in the second region are removed, so as to form a plurality of trenches in the substrate in the second region.

According to an embodiment of the invention, after the trenches are formed, the filling layer is removed to expose surfaces of the first patterned stack layer in the first region. Then, a plurality of buried dielectric layers are formed in the openings between the first patterned stack layers in the first region, and a plurality of isolation structures are formed in the trenches in the second region. Then, the first mask layer is removed to expose a surface of the first conductive layer. Then, a second conductive layer extending along a second direction are formed on the substrate, and each of the first patterned stack layers in the first region is patterned to form a plurality of second patterned stack layers.

According to an embodiment of the invention, a method of removing the filling layer includes a dry etching process or a wet etching process.

According to an embodiment of the invention, the buried dielectric layers and the isolation structures are formed simultaneously.

According to an embodiment of the invention, the step of forming the buried dielectric layers and the isolation structures includes forming a dielectric material layer on the substrate. The dielectric material layer fills into the openings between the first patterned stack layers in the first region and into the trenches in the second region, and covers the first mask layer. Then, using the first mask layer as stopping layer, the dielectric material layer on the first mask layer is removed.

According to an embodiment of the invention, a material of the filling layer is different from a material of the first mask layer.

According to an embodiment of the invention, the material of the filling layer includes a fluid material.

According to an embodiment of the invention, the fluid material includes a photoresist, or an organic dielectric material.

According to an embodiment of the invention, a method of forming the filling layer includes a spin coating process, a high-density plasma chemical vapor deposition (HDPCVD) or an enhanced high aspect ration process (eHARP).

According to an embodiment of the invention, before the step of forming the filling layer, buried doped regions in the substrate at the two sides of each of the first patterned stack layers is formed respectively, and the buried doped regions extend along the first direction.

The invention also provides a method for fabricating a memory device, including providing a substrate. The substrate has a first region and a second region. A plurality of first patterned stack layers is formed in the first region. The first patterned stack layers extend along a first direction, and openings are respectively disposed at two sides of each of the first patterned stack layers. Then, a filling layer is formed on the first patterned stack layers and fills into the openings and extends along the first direction form the first region to the second region. Then, using the filling layer as mask, part of the substrate in the second region are removed, so as to form a plurality of trenches in the substrate in the second region. The filling layer is removed to expose surfaces of the first patterned stack layer in the first region. A plurality of buried dielectric layers are formed in the openings between the first patterned stack layers in the first region, and a plurality of isolation structures are formed in the trenches in the second region. Portions of the first patterned stack layers are removed to expose surfaces of first conductive layers of the first patterned stack layers. A second conductive layer is formed extending along a second direction on the substrate, and each of the first patterned stack layers are patterned to form a plurality of second patterned stack layers.

According to an embodiment of the invention, a method of removing the filling layer includes a dry etching process or a wet etching process.

According to an embodiment of the invention, the buried dielectric layers and the isolation structures are formed simultaneously.

According to an embodiment of the invention, the step of forming the buried dielectric layers and the isolation structures includes forming a dielectric material layer on the substrate. The dielectric material layer fills into the openings between the first patterned stack layers in the first region and into the trenches in the second region, and covers the first mask layer. Then, using the first mask layer as stopping layer, the dielectric material layer on the first mask layer is removed.

According to an embodiment of the invention, a material of the filling layer is different from a material of the first mask layer.

According to an embodiment of the invention, the material of the filling layer includes a fluid material.

According to an embodiment of the invention, the fluid material includes a photoresist, or an organic dielectric material.

In view of the foregoing, the filling layer may serve as mask to etch the trenches in the invention. Then, the buried dielectric layers and isolation structures may be simultaneously formed. Therefore, the method for fabricating the memory device according to the embodiments of the invention simplifies the fabricating process, and consequently achieves functions of reducing process variation and lowering the fabricating cost.

It is to be understood that both the foregoing general description and the following detailed description are exemplary, and are not intended to limit the scope of the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1K are top views illustrating a flow for fabricating a memory device according to an embodiment of the invention.

FIGS. 2A to 2K are respectively cross-sectional schematic views taken along a II-II' line in FIGS. 1A to 1K.

FIGS. 3A to 3K are respectively cross-sectional schematic views taken along a III-III' line in FIGS. 1A to 1K.

DESCRIPTION OF THE EMBODIMENTS

FIGS. 1A to 1K are top views illustrating a flow for fabricating a memory device according to an embodiment of the invention. FIGS. 2A to 2K are respectively cross-sectional schematic views taken along a II-II' line in FIGS. 1A to 1K. FIGS. 3A to 3K are respectively cross-sectional schematic views taken along a III-III' line in FIGS. 1A to 1K. FIG. 4 is a cross-sectional schematic view taken along a IV-IV' line in FIG. 1K.

Figure 2A:
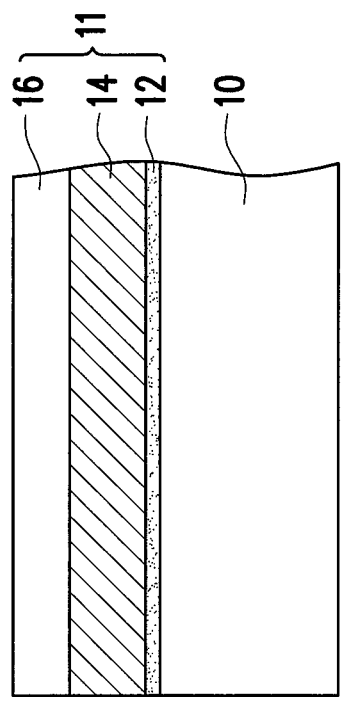
Figure 3A:
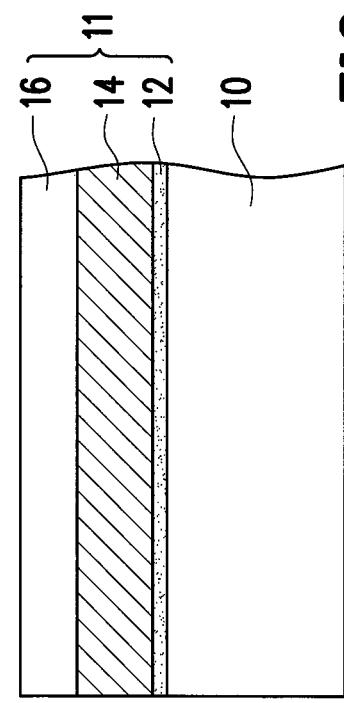
Figure 1A:
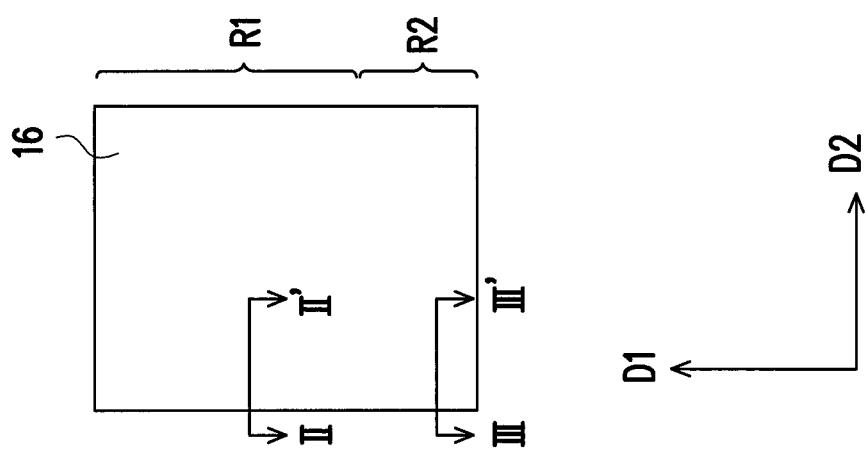
Figure 4:
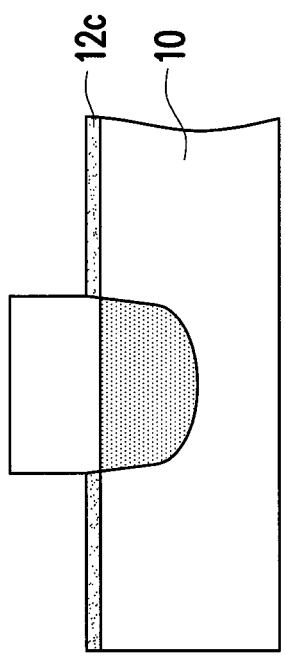
FIG. 4 is a cross-sectional schematic view taken along a IV-IV' line in FIG. 1K.

Referring to FIGS. 1A, 2A, and 3A, first of all, a stack layer 11 is formed on a substrate 10. The substrate 10 has a first region R1 and a second region R2, as shown in FIG. 1A. In an embodiment of the invention, the first region R1 may be an active region, for example, while the second region R2 may be a peripheral region, for example. The substrate 10 is a semiconductor substrate, a semiconductor compound substrate, or a semiconductor-over-insulator (SOI) substrate. The semiconductor is, for example, atoms in group IVA, such as silicon or germanium. The semiconductor compound is, for example, a semiconductor compound composed of atoms in group IVA, such as silicon carbide or silicon germanium, or a semiconductor compound composed of atoms in group IIIA and group VA (e.g. gallium arsenide).

Then, the stack layer 11 is formed on the substrate 10 in the first region R1 and the second region R2. The stack layer 11 includes a storage layer 12 (high-k dielectric for example), a first conductive layer 14 (serving as control gate, for example), and a first mask layer 16. In an embodiment, the storage layer 12 is a composite layer composed of a tunneling dielectric layer, a charge storage layer, and a blocking layer. For example, the composite layer is composed of oxide-nitride-oxide (ONO). The composite layer may include three or more layers, and the invention is not limited thereto. A method of forming the composite layer may be a chemical vapor deposition process, a thermal oxidation process, etc.

A material of the first conductive layer 14 includes, for example, a doped polysilicon, an undoped polysilicon or a combination thereof. In addition, a method of forming the first conductive layer 14 may be a chemical vapor deposition. A material of the first mask layer 16 is a silicon material or a metallic material, for example. As long as the material of the first mask layer 16 has a high etching selectivity ratio with respect to the materials of the substrate 10, the storage layer 12, and the first conductive layer 14, the material of the first mask layer 16 is not limited to those described herein.

Figure 2B:
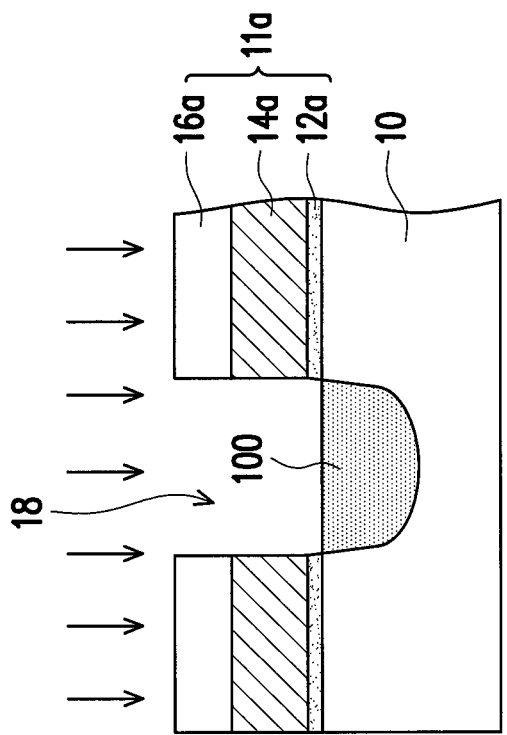
Figure 3B:
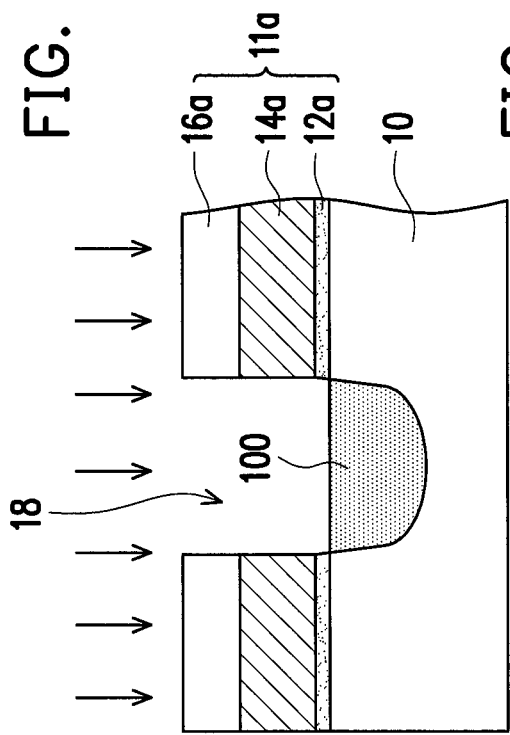
Figure 1B:
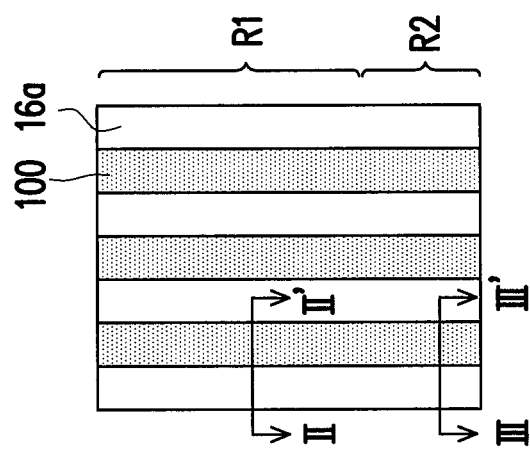

Referring to FIGS. 1B, 2B, and 3B, the stack layer 11 is patterned to form a plurality of patterned stack layers 11a. The patterned stack layers 11a extend along a first direction D1 and from the first region R1 to the second region R2. Openings 18 are respectively disposed at two sides of each of the patterned stack layers 11a. In an embodiment, a method of patterning the stack layer 11 may include using a photolithography process and an etching process to remove part of the first mask layer 16, part of the first conductive layer 14, and part of the storage layer 12, so as to form the openings 18 at the two sides of each of the patterned stack layers 11a and expose a surface of the substrate 10 accordingly, as shown in FIG. 1B. The patterned stack layers 11a include first mask layers 16a, first conductive layers 14a, and storage layers 12a. The etching process may be a dry etching process, such as a sputtering etching process, or a reactive ion etching process, etc.

Then, buried doped regions 100 are formed in the substrate 10 at the two sides of each of the patterned stack layers 11a. Specifically, an ion implantation process is performed, so as to form the buried doped regions 100 in the substrate 10 exposed by the openings 18. In other words, the buried doped regions 100 are located in the substrate 10 exposed by the openings 18 at the two sides of each of the patterned stack layers 11a. The buried doped regions 100 extend along the first direction D1 and from the first region R1 to the second region R2. In an embodiment, the substrate 10 has a first conductivity type, whereas the buried doped regions 100 have a second conductivity type. The first conductivity type is P-type, for example, whereas the second conductivity type is N-type, for example, and vice versa. In an embodiment, a dopant implanted in the buried doped regions 100 may be phosphorus or arsenic, for example, a dose of the dopant is $1.0 \times 10^{15}/cm^2$ to $3.0 \times 10^{15}/cm^2$, for example, and an implanted energy may be 10 keV to 20 keV, for example.

Figure 2C:
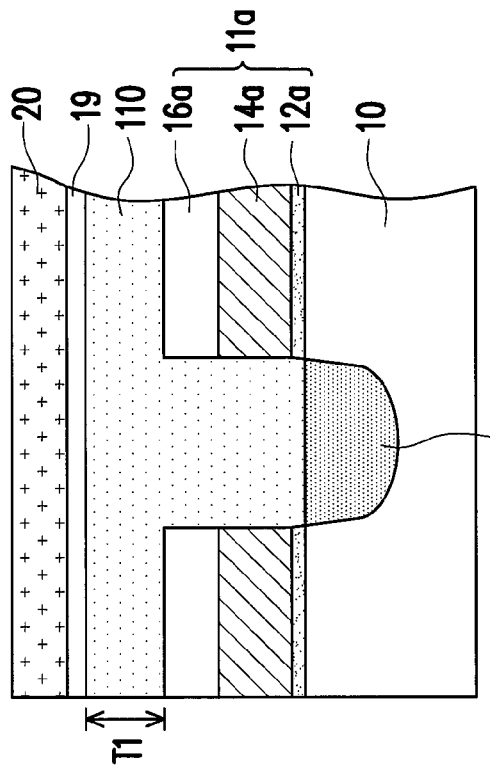
Figure 3C:
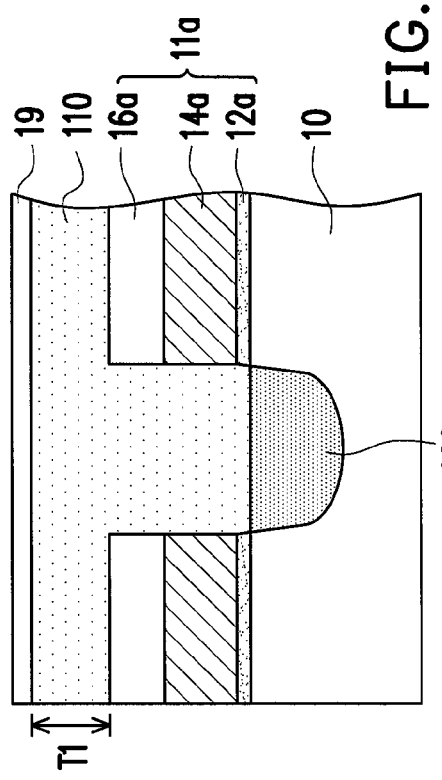
Figure 1C:
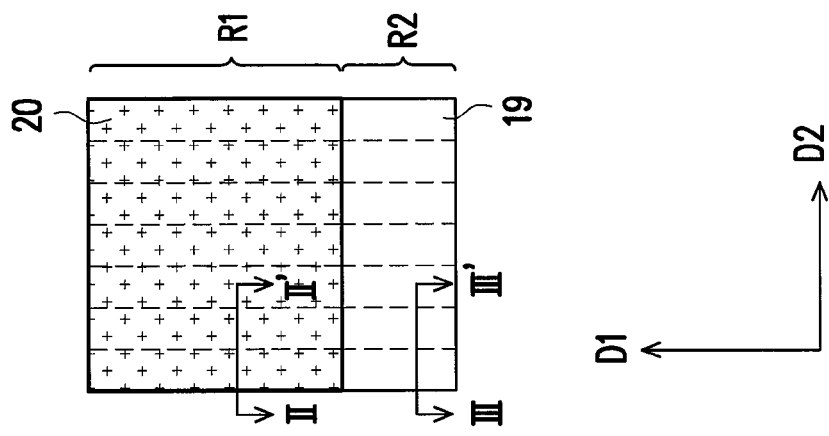

Referring to FIGS. 1C, 2C, and 3C, a filling layer 110 is formed on the substrate 10, and the filling layer 110 is filled into the openings 18. A material of the filling layer 110 according to the embodiments of the invention is different from the material of the first mask layer 16. In addition, the material of the filling layer 110 has a high etching selectivity ratio with respect to the material of the first mask layer 16. The material of the filling layer 110 includes a fluid material. The fluid material may be a photoresist, or an organic dielectric material. The material of the filling layer 110 of the invention is not limited thereto, as long as the material has an excellent filling characteristic and may be filled into a structure having an aspect ratio. A method of forming the filling layer 110 may be a spin coating process, an HDPCVD or an eHARP process, for example. In an embodiment, a thickness T1 of the filling layer 110 on the first mask layer 16 may be 100 nm to 500 nm.

Then, a second mask layer 20 is formed on the first region R1 of the substrate 10. The second mask layer 20 does not cover the filling layer 110 in the second region R2. A material of the second mask layer 20 may be carbon, or a photoresist material, for example. A method of forming the second mask layer 20 may be a spin coating process, for example. In an embodiment, an anti-reflective layer 19 may be further included. The anti-reflective layer 19 is located on the filling layer 110 in the first region R1 and the second region R2. The anti-reflective layer 19 in the first region R1 is located between the second mask layer 20 and the filling layer 110. The anti-reflective layer 19 in the second region R2 is exposed. A material of the anti-reflective layer 19 is an organic polymer, carbon, or silicon oxynitride, for example. The material of the anti-reflective layer 19 is different from the material of the second mask layer 20, and a method of forming the anti-reflective layer 19 is a spin coating process or CVD process, for example.

Figure 2D:
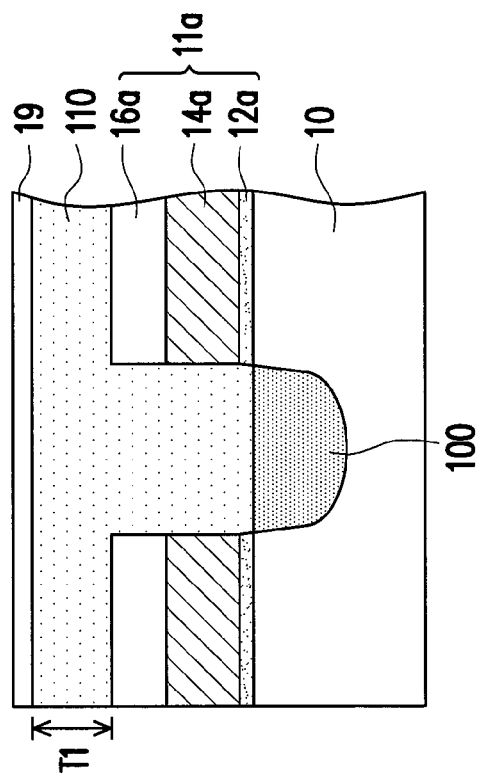
Figure 3D:
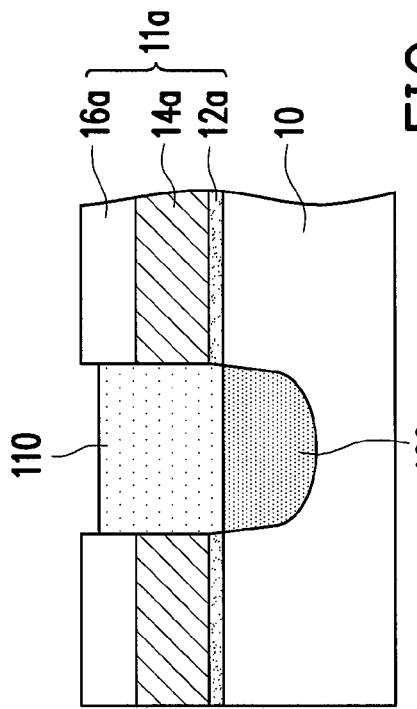
Figure 1D:
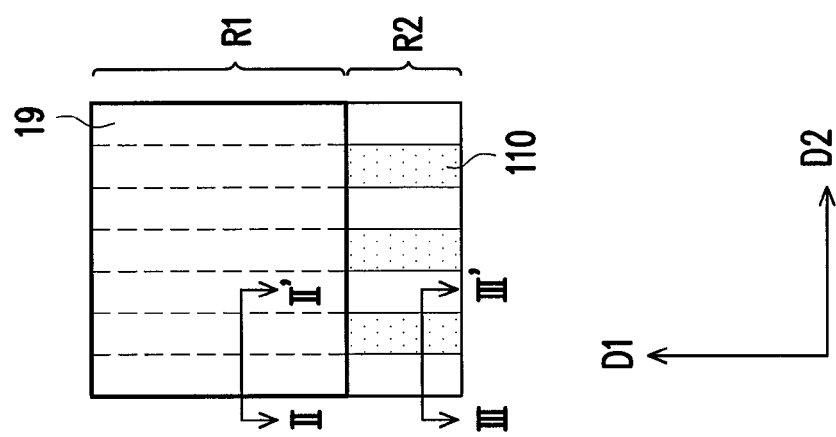

Then, referring to FIGS. 1D, 2D, and 3D, using the second mask layer 20 shown in FIGS. 1C, 2C, and 3C as mask, the anti-reflective layer 19 and part of the filling layer 110 in the second region R2 is removed, so as to expose a top surface of the first mask layer 16 in the second region R2. Specifically, in an etching process, the filling layer 110 is over etched to ensure that the filling layer 110 on the top surface of the first mask layer 16 in the second region R2 is completely removed. As a result, in the second region R2, a top surface of the filling layer 110 in the openings 18 is slightly lower than the top surface of the first mask layer 16 in the second region R2. A method of removing the anti-reflective layer 19 and part of the filling layer 110 may be a dry etching process, such as a sputtering etching process, or a reactive ion etching process, for example. Then, the second mask layer 20 is removed. In an embodiment, a method of removing the second mask layer 20 may includes performing a high density plasma process to ash the patterned second mask layer 20, and then performing a wet cleaning process.

Figure 2E:
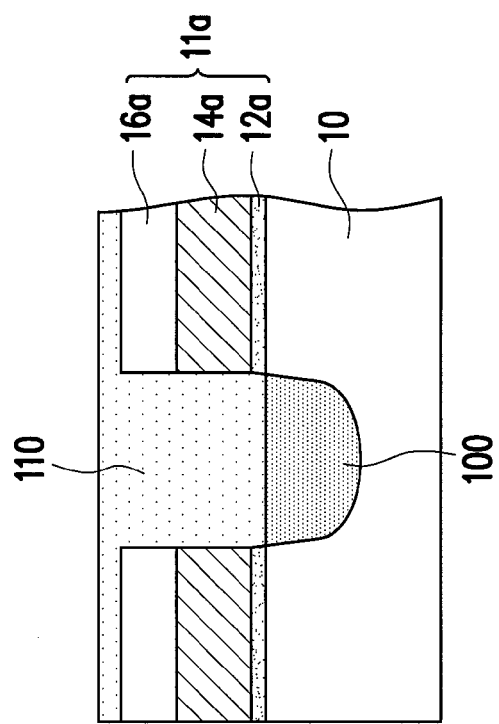
Figure 3E:
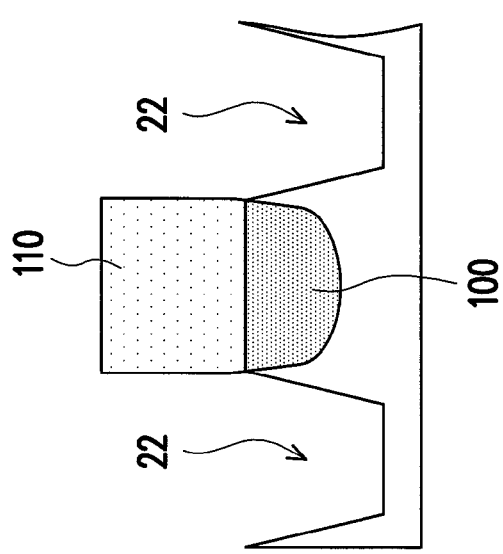
Figure 1E:
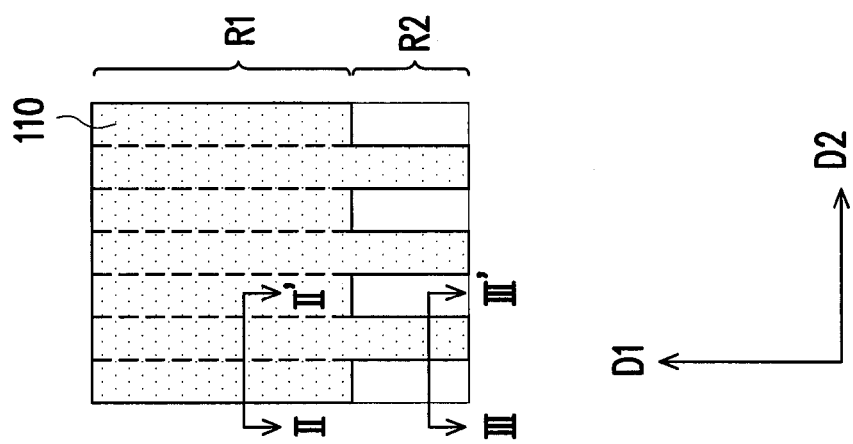

Referring to FIGS. 1E, 2E, and 3E at the same time, using the anti-reflective layer 19 and the filling layer 110 shown in FIGS. 1C, 2C, and 3C as mask, the patterned stack layers 11a and part of the substrate 10 below the patterned stack layers 11a in the second region R2 is removed, so as to form a plurality of trenches 22 in the substrate 10 in the second region R2 (as illustrated in FIGS. 1D, 2D, and 3D). Referring to FIG. 3D, the filling layer 110 is located above the buried doped regions 100. Thus, when the filling layer 110 serves as etching mask layer, the filling layer 110 may be self-aligned with regions not covered with the filling layer 110 to form the trenches 22. Therefore, an issue of misalignment due to performing a plurality of photolithography processes does not arise. Thus, the trenches 22 may be referred to as self-aligned contact regions. The filling layer 110 on the first mask layers 16a has the sufficient thickness T1. Therefore, even though the anti-reflective layer 19 and part of the filling layer 110 in the first region R1 may be simultaneously removed when removing the patterned stack layer 11a and the part of the substrate 10 in the second region R2, there is still part of the filling layer 110 remaining and covering top surfaces of the first mask layers 16a in the first region R1 (FIG. 1E and FIG. 2E). Thus, the first mask layers 16a in the first region R1 are not damaged by etching.

Figure 2F:
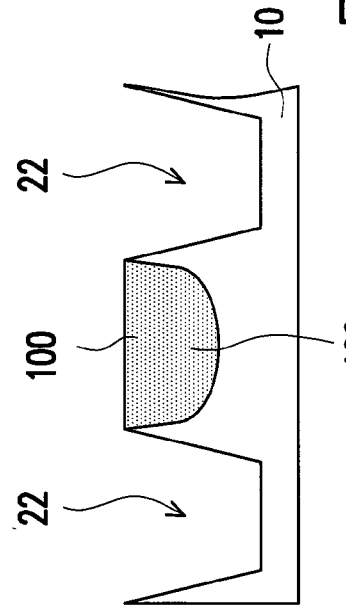
Figure 3F:
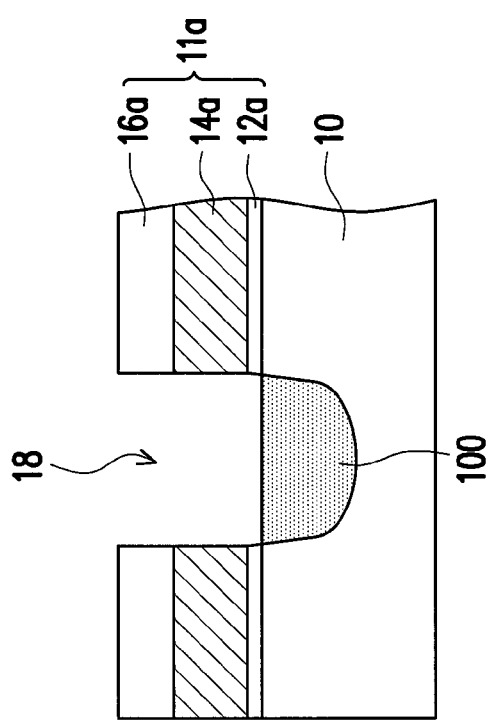
Figure 1F:
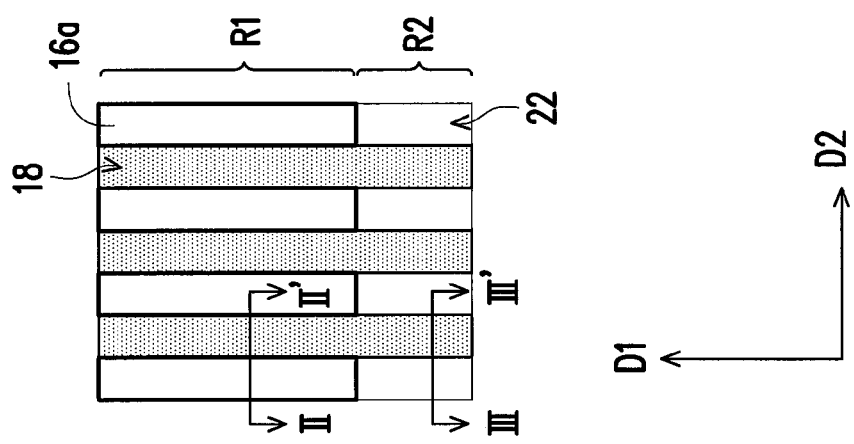

Referring to FIGS. 1F, 2F, and 3F, the filling layer 110 is removed to expose surfaces of the patterned stack layers 11a in the first region R1 and expose the buried doped regions 100 in the first region R1 and the second region R2. A method of removing the filling layer 110 includes performing a dry strip and a wet strip. The dry strip may be a sputtering etching process, or a reactive ion etching process, for example. The wet strip is to perform etching by using an etchant such as a mixed solution of hydrofluoric acid, nitric acid and hydrofluoric acid, or a hot phosphoric acid (at 150° C. to 200° C.), for example.

Figure 2G:
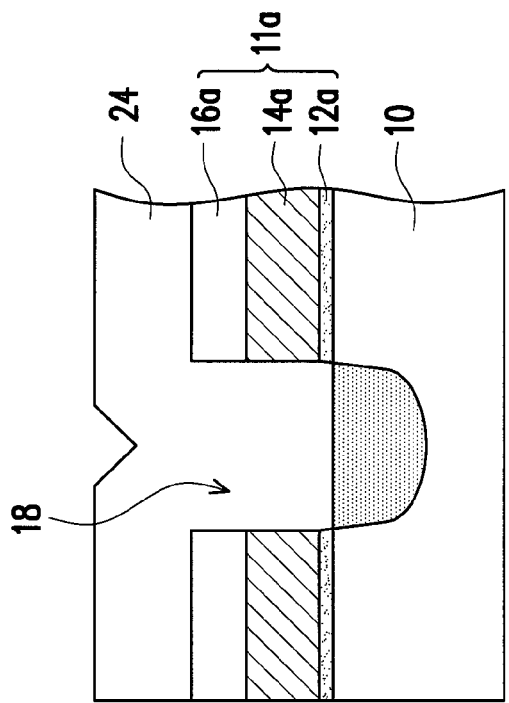
Figure 3G:
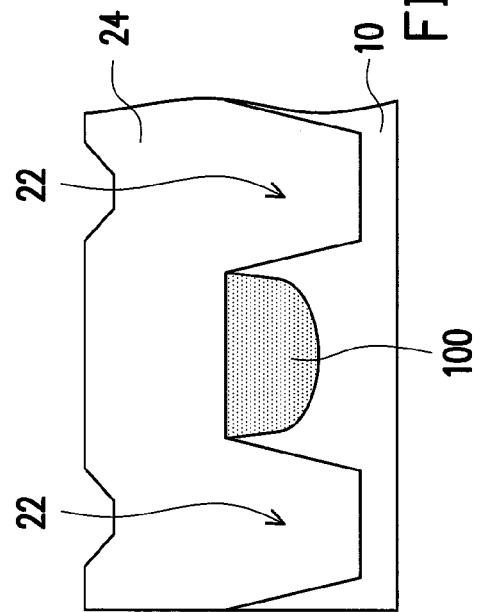
Figure 1G:
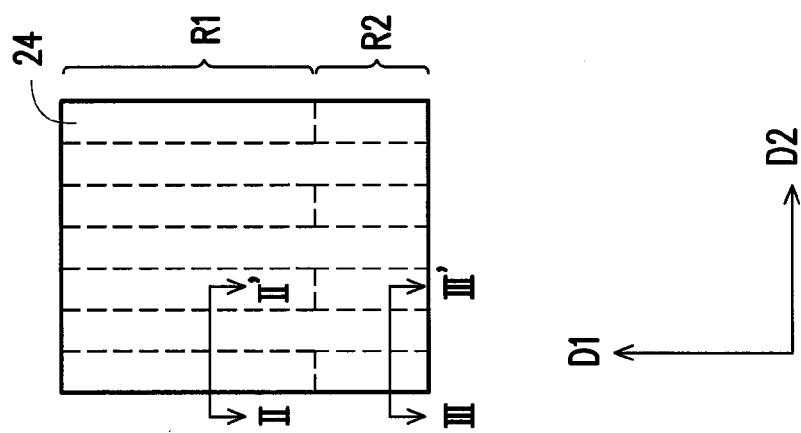

Referring to FIGS. 1G, 2G, and 3G, a dielectric material layer 24 is formed on the substrate 10. The dielectric material layer 24 fills into the openings 18 in the first region R1, and fills into the trenches 22 in the second region R2. In addition, the dielectric material layer 24 covers the first mask layers 16a. A material of the dielectric material layer 24 is silicon oxide, for example. The silicon oxide is a spin-on dielectric (SOD) oxide, a high density plasma (HDP) oxide, or an oxide formed by an enhanced high aspect ration process (eHARP) for example.

Figure 2H:
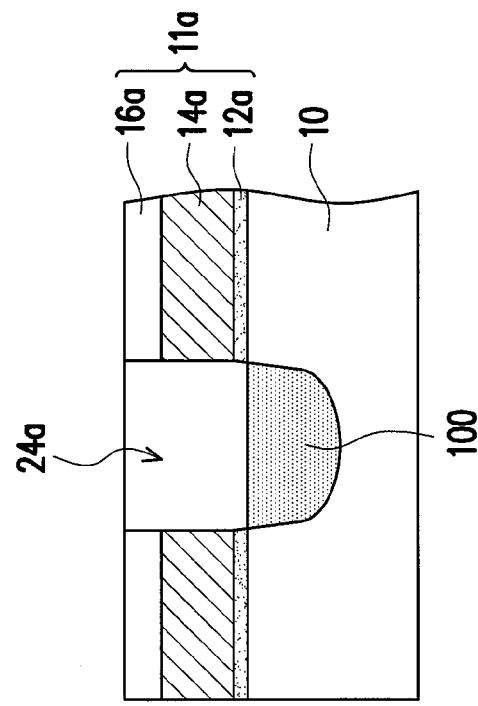
Figure 3H:
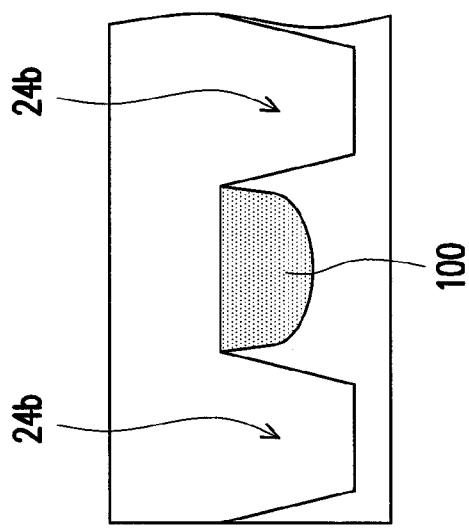
Figure 1H:
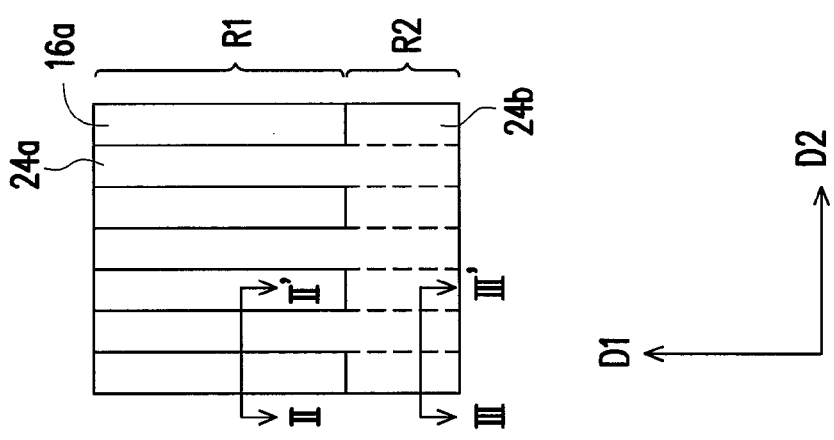

Referring to FIGS. 1H, 2H, and 3H, using the first mask layers 16a as stopping layer, the dielectric material layer 24 on the first mask layers 16a is removed, so as to simultaneously form a plurality of buried dielectric layers 24a in the openings 18 between the first patterned stack layers 11a in the first region R1 and form a plurality of isolation structures 24b in the trenches 22 in the second region R2. A method of removing the dielectric material layer 24 on the first mask layers 16a is a chemical mechanical polishing (CMP) process, for example. Top surfaces of the buried dielectric layers 24a and the top surfaces of the first mask layers 16a may be coplanar. Alternatively, the top surfaces of the buried dielectric layers 24a may be slightly lower than the top surface of the first mask layer 16 due to over-polishing.

Figure 2I:
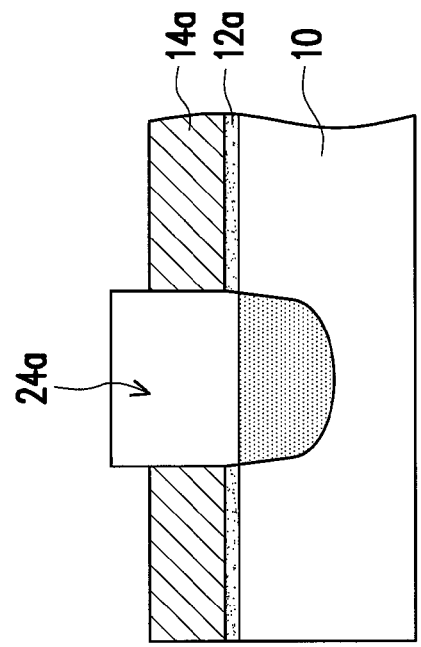
Figure 3I:
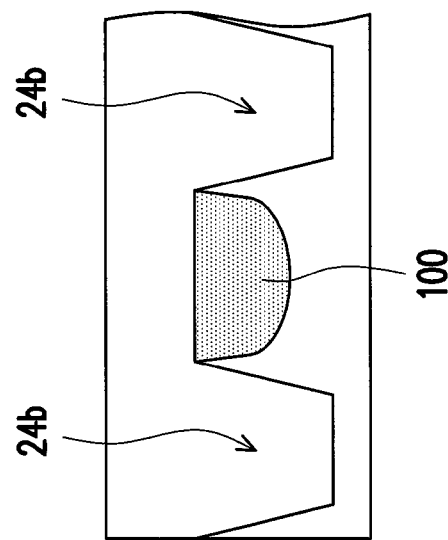
Figure 1I:
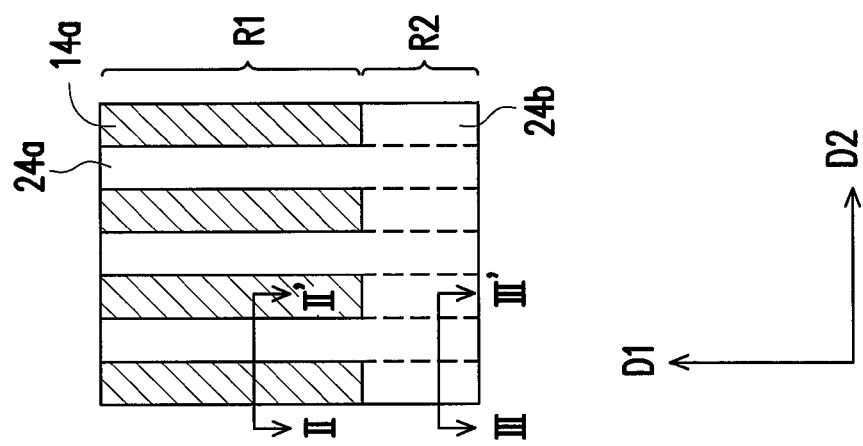
Figure 2K:
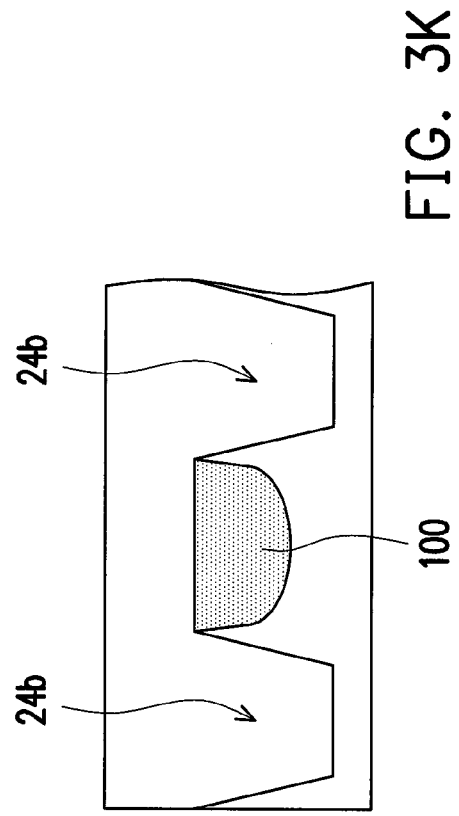
Figure 3K:
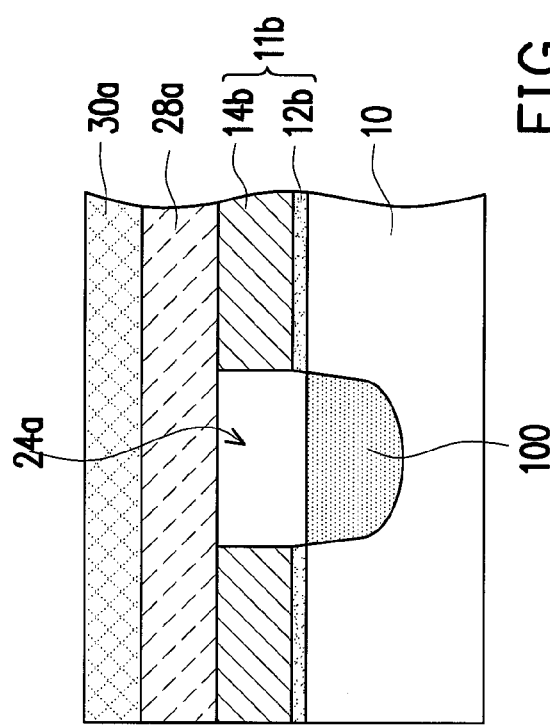
Figure 1K:
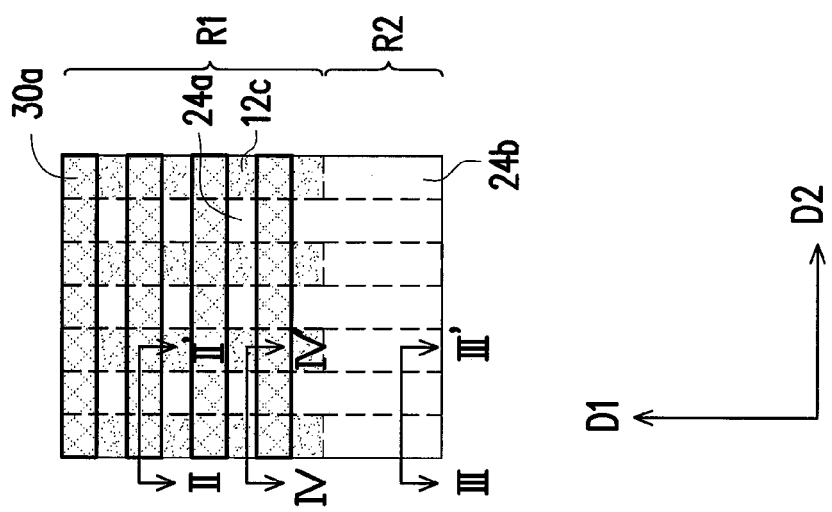

Referring to FIGS. 1I, 2I, and 3I, the first mask layers 16a are removed, so as to expose surfaces of the first conductive layers 14a, the buried dielectric layers 24a, and the isolation structures 24b. A method of removing the first mask layers 16a includes a wet etching process. The wet etching process may be a process by hot $H_3PO_4$, for example.

Referring to FIGS. 1J, 2J, and 3J, a second conductive layer 28, and a mask layer 30 are sequentially formed on the substrate 10. In an embodiment, a material of forming the second conductive layer 28 includes, for example, a doped polysilicon, an undoped polysilicon, or a combination thereof. A method of forming the second conductive layer 28 may be a chemical vapor deposition process, for example. A thickness of the second conductive layer 28 may range between 500 angstroms to 1000 angstroms, for example.

Referring to FIGS. 1K, 2K, and 3K and FIG. 4, the mask layer 30, and the second conductive layer 28 are patterned by performing a photolithography process and an etching process, so as to form a plurality of mask layers 30a, and a plurality of second conductive layers 28a (serving as word lines, for example) extending along a second direction D2 on the substrate 10. In addition, each of the first conductive layers 14a in the first region R1 are continued to be etched, so as to form the first conductive layers 14b. An etching process may be a dry etching process, such as a sputtering etching process, or a reactive ion etching process, for example. The storage layers 12a include storage layers 12b covered by the first conductive layers 14b and storage layers 12c not covered by the first conductive layers 14b. Each of the patterned stack layers 11b includes the storage layer 12b and the first conductive layer 14b. The plurality of patterned stack layers 11b are located on the substrate 10 in the first region R1. The buried dielectric layers 24a are located between the patterned stack layers 11b, such that the plurality of patterned stack layers 11b are electrically insulated from each other. In an embodiment, an N×N matrix may be formed.

Since the filling layer 110 has an excellent filling characteristic and is easy to coat and be removed, in the invention, the filling layer 110 may be filled between the stack layers 11a after the second patterning process (FIG. 3C). Moreover, due to the high etching selectivity ratio between the filling layer 110 and the first mask layers 16a, the filling layer 110 may serve as mask layer to form the trenches 22 in the substrate 10 (FIG. 3E). After the filling layer 110 is removed, the dielectric material layer 24 is formed on the substrate 10. After a chemical mechanical polishing or etching back process, the isolation structures 24b may be formed in the trenches 22, and the buried dielectric layers 24a may be simultaneously formed between the patterned stack layers 11b (FIGS. 2G, 3G, 2H and 3H).

As shown in FIGS. 1K, 2K, 3K, and FIG. 4, the memory device according to an embodiment of the invention includes the plurality of second conductive layers 28a (serving as word lines, for example), the plurality of patterned stack layers 11b, the plurality of buried dielectric layers 24a, the plurality of buried doped regions 100, and the plurality of isolation structures 24b. The plurality of buried doped regions 100 (serving as bit lines, for example) are located in the substrate 10 in the first region R1 and the second region R2 and extend along the first direction D1. The second conductive layer 28a is located on the first region R1 and extends along the second direction D2 across the buried doped regions 100. A plurality of patterned stack layers 11b are located below each of the second conductive layers 28a. Each of the patterned stack layers 11b includes the storage layer 12b and the first conductive layer 14b. The buried dielectric layers 24a extend along the first direction D1, and are located above the buried doped regions 100 in the first region R1 and the second region R2. Each of the buried dielectric layers 24a in the first region R1 separate the two adjacent patterned stack layers 11b. The buried dielectric layers 24a on the second region R2 form an integral structure with the isolation structures 24b at two sides of the buried doped regions 100.

In view of the foregoing, the filling layer formed on the buried doped regions (serving as bit lines, for example) in the invention may serve as mask during etching of trenches, such that the trenches may self-align to be formed at the two sides of the buried doped regions. In addition, the method of fabrication does not require a plurality of photolithography processes. Only simple photolithography, deposition, and flattening processes are used to simultaneously form the buried dielectric layers and the isolation structures. Thus, the method for fabricating the memory device according to the embodiments of the invention simplifies the fabricating process, and consequently achieves functions of reducing process variation and lowering the fabricating cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a memory device, comprising:
providing a substrate, wherein the substrate has a first region and a second region;
forming a stack layer on the substrate in the first region and the second region, wherein the stack layer comprises a storage layer, a first conductive layer, and a first mask layer;
patterning the stack layer to form a plurality of first patterned stack layers, wherein the first patterned stack layers extend along a first direction and from the first region to the second region, and openings are respectively disposed at two sides of each of the first patterned stack layers;
forming a filling layer on the substrate, wherein the filling layer fills into the openings;
forming a second mask layer on the first region of the substrate, wherein the second mask layer does not cover the filling layer in the second region; and
using the filling layer as mask, removing the first patterned stack layers and part of the substrate in the second region, so as to form a plurality of trenches in the substrate in the second region.

2. The method for fabricating the memory device as claimed in claim 1, after forming the trenches, further comprising:
removing the filling layer to expose surfaces of the first patterned stack layer in the first region;
forming a plurality of buried dielectric layers in the openings between the first patterned stack layers in the first region, and forming a plurality of isolation structures in the trenches in the second region;
removing the first mask layer to expose a surface of the first conductive layer; and
forming a second conductive layer extending along a second direction on the substrate, and patterning each of the first patterned stack layers in the first region to form a plurality of second patterned stack layers.

3. The method for fabricating the memory device as claimed in claim 2, wherein a method of removing the filling layer comprises a dry etching process or a wet etching process.

4. The method for fabricating the memory device as claimed in claim 2, wherein the buried dielectric layers and the isolation structures are formed simultaneously.

5. The method for fabricating the memory device as claimed in claim 2, wherein the step of forming the buried dielectric layers and the isolation structures comprises:
forming a dielectric material layer on the substrate, wherein the dielectric material layer fills into the openings between the first patterned stack layers in the first region and into the trenches in the second region, and covers the first mask layer; and
using the first mask layer as stopping layer, removing the dielectric material layer on the first mask layer.

6. The method for fabricating the memory device as claimed in claim 1, wherein a material of the filling layer is different from a material of the first mask layer.

7. The method for fabricating the memory device as claimed in claim 6, wherein the material of the filling layer comprises a fluid material.

8. The method for fabricating the memory device as claimed in claim 7, wherein the fluid material comprises a photoresist, or an organic dielectric material.

9. The method for fabricating the memory device as claimed in claim 7, wherein a method of forming the filling layer comprises a spin coating process, a high-density plasma chemical vapor deposition process or an enhanced high aspect ration process.

10. The method for fabricating the memory device as claimed in claim 1, before the step of forming the filling layer, further comprising:

respectively forming buried doped regions in the substrate at the two sides of each of the first patterned stack layers, wherein the buried doped regions extend along the first direction.

11. The method for fabricating the memory device as claimed in claim 1, wherein the first mask layer comprises a silicon material or a metallic material.

12. The method for fabricating the memory device as claimed in claim 1, wherein the second mask layer comprises carbon or a photoresist material.

13. The method for fabricating the memory device as claimed in claim 1, further comprises after the step of forming the filling layer, forming an anti-reflective (ARC) layer on the filling layer.

14. A method for fabricating a memory device, comprising:
providing a substrate, wherein the substrate has a first region and a second region;
forming a plurality of first patterned stack layers in the first region, wherein the first patterned stack layers extend along a first direction, and openings are respectively disposed at two sides of each of the first patterned stack layers;
forming a filling layer on the first patterned stack layers, wherein the filling layer at least fills into the openings and extend along the first direction form the first region to the second region;
using the filling layer as mask, removing part of the substrate in the second region, so as to form a plurality of trenches in the substrate in the second region;
removing the filling layer to expose surfaces of the first patterned stack layer in the first region;
forming a plurality of buried dielectric layers in the openings between the first patterned stack layers in the first region, and forming a plurality of isolation structures in the trenches in the second region;
removing portions of the first patterned stack layers to expose surfaces of first conductive layers of the first patterned stack layers; and
forming a second conductive layer extending along a second direction on the substrate, and patterning each of the first patterned stack layers to form a plurality of second patterned stack layers.

15. The method for fabricating the memory device as claimed in claim 14, wherein a method of removing the filling layer comprises a dry etching process or a wet etching process.

16. The method for fabricating the memory device as claimed in claim 14, wherein the buried dielectric layers and the isolation structures are formed simultaneously.

17. The method for fabricating the memory device as claimed in claim 14, wherein the step of forming the buried dielectric layers and the isolation structures comprises:
forming a dielectric material layer on the substrate, wherein the dielectric material layer fills into the openings between the first patterned stack layers in the first region and into the trenches in the second region, and covers the first mask layer; and
using the first mask layer as stopping layer, removing the dielectric material layer on the first mask layer.

18. The method for fabricating the memory device as claimed in claim 14, wherein a material of the filling layer is different from a material of the first mask layer.

19. The method for fabricating the memory device as claimed in claim 18, wherein the material of the filling layer comprises a fluid material.

20. The method for fabricating the memory device as claimed in claim 19, wherein the fluid material comprises a photoresist, or an organic dielectric material.

* * * * *